United States Patent [19]

Suzuki et al.

[11] Patent Number: 4,551,417

[45] Date of Patent: Nov. 5, 1985

[54] METHOD OF FORMING PATTERNS IN MANUFACTURING MICROELECTRONIC DEVICES

[75] Inventors: Masayoshi Suzuki; Kazuhide Saigo, both of Tokyo, Japan

[73] Assignee: NEC Corporation, Tokyo, Japan

[21] Appl. No.: 501,201

[22] Filed: Jun. 6, 1983

[30] Foreign Application Priority Data

Jun. 8, 1982 [JP] Japan .................................. 57-98089
Jun. 8, 1982 [JP] Japan .................................. 57-98090
Jul. 16, 1982 [JP] Japan .................................. 57-123865
Jul. 16, 1982 [JP] Japan .................................. 57-123866
Nov. 5, 1982 [JP] Japan .................................. 57-194286

[51] Int. Cl.$^4$ .............................................. G03C 5/16
[52] U.S. Cl. .................................... 430/316; 430/313; 430/317; 430/323; 430/270; 430/280; 156/643; 156/659.1
[58] Field of Search ............... 430/313, 314, 317, 312, 430/323, 270, 280, 287; 156/643, 659.1

[56] References Cited

U.S. PATENT DOCUMENTS

| | | | |
|---|---|---|---|
| 4,208,241 | 6/1980 | Harshbarger et al. ............... | 156/643 |
| 4,237,208 | 12/1980 | Desai et al. .......................... | 430/270 |
| 4,357,369 | 11/1982 | Kilichowski et al. ........... | 430/313 X |
| 4,370,405 | 1/1983 | O'Toole et al. ...................... | 430/313 |
| 4,481,049 | 11/1984 | Reichmanis et al. ........... | 430/313 X |

OTHER PUBLICATIONS

J. M. Moran and D. Maydan, "High Resolution, Steep Profile Resist Patterns", *Journal of Vacuum Science and Technology*, vol. 16, No. 6, Nov./Dec. 1979, pp. 1620–1624.

M. Suzuki, K. Saigo, H. Gokan, Y. Onishi, "Copolymers of Trimethylsilylstyrene with Chloromethylstyrene for a Bi-Layer Resist System", *Chemical Abstracts*, vol. 99, 1983, (Original Reference: *Journal of Electrochemical Society*, vol. 130, No. 9 (Sep. 1983) pp. 1962–1964), No. 99:166882h.

Suzuki et al., *Journal of the Electrochemical Society*, vol. 130, No. 6, 1983, pp. 1962–1964.

S. A. MacDonald et al., "Organometallic Resists: $O_2$RIE Resistant Materials Derived from Polystyrene", IBM Research, an abstract from a paper presented on May 31, 1983 at Los Angeles at 1983 International Symposium on Electron, Ion and Photon Beams, 2 pages.

S. A. MacDonald et al., "The Development of Oxygen Reactive Ion Etch Barriers Based on Poly(trimethylstannylstyrene)", *Proceedings of American Chemical Society* 186th National Meeting, vol. 49, 1983, Washington, D.C., pp. 104–106.

*Primary Examiner*—John Kittle
*Assistant Examiner*—Cynthia Hamilton
*Attorney, Agent, or Firm*—Burns, Doane, Swecker and Mathis

[57] ABSTRACT

A method of forming fine patterns in the manufacture of microelectronic devices by using optical or electron-beam lithography and a dry etching technique such as reactive sputter etching with oxygen. The substrate surface is covered with a relatively thick organic layer, and a thin resist film is formed thereon. The material of the resist layer is a polymer or copolymer comprising trialkylsilyl group, dimethylphenylsilyl group or trialkoxysilyl group. The thickness of the resist film is so adjusted as to contain a sufficient number of trialkylsilyl, dimethylphenylsilyl or trialkoxysilyl groups per unit area of the resist pattern to thereby ensure high endurance of the resist to dry etching for etching the thick organic layer.

21 Claims, 1 Drawing Figure

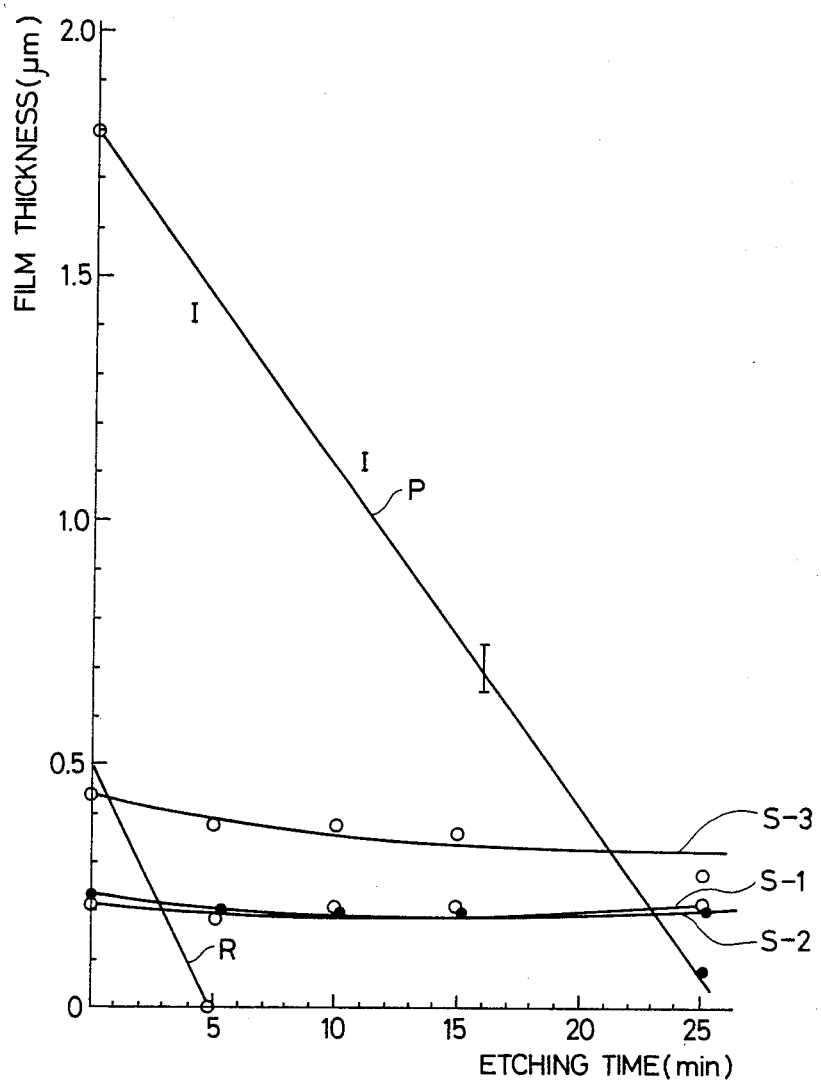

METHOD OF FORMING PATTERNS IN MANUFACTURING MICROELECTRONIC DEVICES

BACKGROUND OF THE INVENTION

This invention relates to a method of forming patterns in the manufacture of microelectronic devices such as LSI devices and bubble memory devices, and more particularly to a pattern forming method which employs a dry etching technique for the transfer of resist patterns and utilizes a novel resist material.

In the manufacture of microelectronic devices such as semiconductor integrated circuit devices including LSI devices and bubble memory devices, optical lithography and electron-beam lithography are prevailing techniques to form fine patterns. With the recent tendency to make the patterns in such devices ever finer, dry etching processes such as gas plasma etching, reactive sputter etching and ion milling have been employed in place of the conventional wet etching processes for transferring resist patterns obtained by an exposure and development process to the substrates with high accuracy. Accordingly there is a keen demand for improved resist materials that are sufficiently endurant to dry etching and high in sensitivity and resolving capability.

The thickness of a resist layer is an important factor in realization of high resolution patterns. However, in the industrial manufacturing processes it is not rare for the surface of the substrate to be etched to have steps, and in such cases it is required to form a considerably thick resist layer in order to accomplish complete coverage of the steps and to provide a flat surface. This is unfavorable for attaining high resolution. When using a negative type resist, it is very difficult to form a high resolution pattern in a thick resist layer because swelling of the resist during the development treatment becomes significantly detrimental to the precision of the pattern. Also when using a positive type resist, high resolution patterning of a thick resist layer is difficult due to adverse influences of backscattering from the substrate in the case of electron-beam lithography and reflection from the substrate in the case of optical lithography. Particularly over the stepped areas of the substrate, significant variations in the resist pattern linewidth are liable to occur despite constantness of exposure by reason of extraordinarily strong proximity effects.

To solve such difficulties, J. M. Moran et al have proposed a three-layer technique in Journal of Vacuum Science and Technology, Vol. 16, No. 6, pp. 1620–1624 (1979). Accordingly to this three-layer technique the first layer which covers the subsrate surface and provides a flat surface is a sufficiently thick layer of an organic material, and the intermediate layer is formed of an inorganic material that can not easily be etched by dry etching using oxygen, such as silicon dioxide or silicon nitride. The third or top layer is a thin resist layer. In the patterning process, first the resist layer is exposed to light, X-ray or electron-beam and developed to generate a high resolution pattern. Next, the intermediate layer is subjected to dry etching with the resist pattern as a mask, and then the pattern of the intermediate layer is transferred into the thick organic layer by reactive sputter etching using oxygen gas. By employing this three-layer technique a high resolution pattern can be generated in the resist layer firstly because it is possible to use a desirably thin resist layer for pattern generation and secondly because unfavorable influences of backscattering of electrons from the substrate or reflection of light waves from the substrate can be avoided. The high resolution pattern can accurately be transferred into the thick organic layer by sequential etching.

However, from an industrial point of view it is a disadvantage of the three-layer technique that the processing operations become complicated and time-consuming mainly because of the addition of the intermediate layer which is formed by vacuum deposition, sputtering or plasma CVD method.

If it is practical to use a resist material that is endurant to dry etching using oxygen, it becomes possible to etch a thick organic layer by directly using the resist layer for initial patterning as a mask, and hence the above described three-layer structure can be simplified to a two-layer structure. To our knowledge, however, such a convenient resist material is not available in the present state of the art. Polydimethylsiloxane is known as endurant to dry etching to such extent that the etch rate of this material by $O_2$ plasma etching is nearly zero. However, polydimethylsiloxane is unsuitable for practical use as a patterning resist material because this material is liquid at room temperature even in the form of coating film so that the film is liable to suffer from adhesion of dust particles, damages on the surface and/or inconvenience for handling attributed to its fluidity.

SUMMARY OF THE INVENTION

It is an object of the present invention to provide a method of forming fine patterns by using a dry etching technique in the manufacture of microelectronic devices, which method enables to relatively easily obtain high resolution patterns and requires less steps than a pattern forming method using the above discussed three-layer technique.

In another aspect, an object of the invention is to provide a novel resist material which is sufficiently endurant to dry etching using oxygen and suitable for use in practical manufacturing processes.

A pattern forming method according to the invention comprises the steps of forming an organic polymer layer which can be etched by dry etching on a substrate to ultimately be etched; forming a resist film on the organic polymer layer, the material of the resist film being a polymer comprising a substituted silyl group selected from trialkylsilyl group, dimethylphenylsilyl group and trialkoxysilyl group, and forming a desired pattern in the resist film by using a lithography technique such that the number of the substituted silyl groups in the patterned resist film is at least $1 \times 10^{16}$ per $1$ cm$^2$; etching the organic polymer layer by a dry etching technique with the patterned resist film as a mask; and etching the substrate with the unetched areas of the organic polymer layer as a mask.

The primary feature of the invention resides in the resist film. The polymer as the resist material must comprise a monomer unit having a trialkylsilyl group, dimethylphenylsilyl group or trialkoxysilyl group, and the composition of the resist material and the thickness of the resist film must be such that the number of the substituted silyl groups in the resist film is not less than $1 \times 10^{16}$/cm$^2$. Insofar as these requirements are met, the resist material be either a polymer of only a monomer having a substituted silyl group or a copolymer of such a monomer with another monomer which needs not to have any silicon-containing group. For the organic polymer layer that directly covers the substrate surface, use is made of a conventional polymer material such as novolak resin.

We have discovered that polymers formed by using a monomer having a substituted silyl group as specified above are remarkably endurant to oxygen plasma and, besides, exhibit a unique tendency in etch rate. When any of such polymers is formed into a film such that the number of trialkylsilyl, dimethylphenylsilyl or trialkoxysilyl groups in the film is at least $1 \times 10^{16}/cm^2$ and the film is subjected to reactive sputter etching using oxygen, there occurs lowering in the etch rate with the lapse of time and, in a short time, the etch rate becomes below a few angstroms per minute so that in a practical sense the resist film does not undergo further etching. For comparison, in the case of a widely used novolak resin film the etch rate remains constant at a relatively high level such as 700–800 Å/min with practically no change with etching time. Therefore, a resist pattern formed in the method according to the invention exhibits sufficient endurance to serve as a mask for dry etching of the underlying organic polymer layer which may be a relatively thick layer. The number of the substituted silyl groups in the resist film depends on the thickness of the resist film, but it is unsuitable to make the resist film unnecessarily thick because then it becomes difficult to form fine patterns resist by a usual exposure and development process.

By using the pattern forming method according to the invention, a fine pattern formed in a very thin resist film can accurately be transferred into a relatively thick organic polymer layer. Fine and high resolution patterns can easily be obtained firstly because the resist film can be made sufficiently thin and secondly because the organic polymer layer directly covering the substrate surface can be made thick enough to completely cover possible steps on the substrate surface and to avoid unfavorable influences of backscattering from the substrate in the case of using electron-beam lithography and reflection from the substrate in the case of using optical lithography. As an additional advantage of this method, the processing steps are simplified compared with the three-layer technique described hereinbefore.

Other objects, features and advantages of the present invention will become apparent from the following detailed description with reference to the accompanying drawing.

BRIEF DESCRIPTION OF THE DRAWING

The single FIGURE is a graph showing the manner of changes in the thickness of resist film subjected to reactive sputter etching using oxygen with respect to some examples of the present invention and conventional materials for reference.

DESCRIPTION OF THE PREFERRED EMBODIMENTS

As to monomers having trialkylsilyl group, dimethylphenylsilyl group or trialkoxysilyl group to form resist materials according to the invention, it is preferred to make selection from ones represented by the following general formulas.

Monomers having trialkylsilyl group:

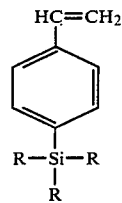

where R represents a lower alkyl group such as methyl, ethyl, propyl or butyl group.

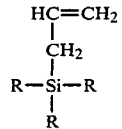

where R represents a lower alkyl group.

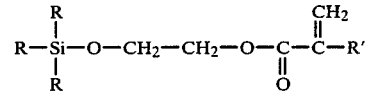

where R represents a lower alkyl group, and R' represents hydrogen atom or a lower alkyl group. Monomers having dimethylphenylsilyl group:

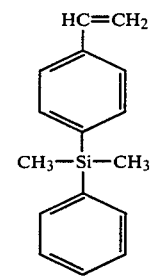

Monomers having trialkoxysilyl group:

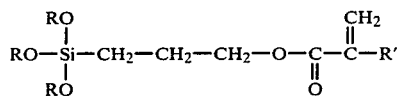

where R represents a lower alkyl group, and R' represents hydrogen atom or a lower alkyl group.

In the case of using a copolymer as the resist material, it is suitable to copolymerize an ethylenic unsaturated monomer with a monomer having a substituted silyl group. Examples of useful ethylenic unsaturated monomers are methyl, ethyl, propyl, glycidyl, vinyl and allyl esters of acrylic acid or methacrylic acid, derivatives of styrene such as divinylbenzene, o-, m- or p-chloromethylstyrene and α-methylstyrene, vinyl acetate, diallyl phthalate, diallyl terephthalate, methylvinyl ketone, N-vinylpyrrolidone and vinylpyridine.

The resist materials according to the invention are soluble in a variety of familiar organic solvents and high in glass transition temperature and, therefore, can easily be formed into a film of good quality. These resist materials are highly endurant to oxygen plasma as described hereinbefore, and they are glassy at room temperature and hence convenient for practical uses.

In the case of polymers having trialkoxysilyl groups, sometimes the resist film tends to undergo hydrolysis if left standing for a long time and consequently undergoes cross-linking to become less soluble in organic solvents. Polymers having trialkylsilyl group or dimethylphenylsilyl group do not exhibit such tendency and therefore are preferable.

In the pattern forming method according to the invention, first the substrate surface is covered with the organic polymer layer and then the resist film is formed usually by spinning of a solution of a selected resist material in an organic solvent and drying the applied solution by adequate heating. Then a desired pattern is delineated on the resist film by using electron-beam, X-ray or deep ultraviolet ray for example, and development is performed by using a suitable developer. By using the resist pattern obtained in this way as a mask, the underlying organic polymer layer is etched preferably by a reactive sputter etching using oxygen.

The invention will further be illustrated by the following nonlimitative examples.

EXAMPLE 1

In a three-neck flask equipped with a thermometer, reflux condenser and a nitrogen gas feed pipe, 3.5 g of anhydrous p-trimethylsilylstyrene (abbreviated to SiSt) refined by distillation over calcium hydride was mixed with 30 ml of benzene dehydrated by metallic sodium and 0.014 g (0.3 mole% of SiSt) of benzoyl peroxide (BPO) and subjected to polymerization reaction for 8 hr at a reflux temerature. Upon completion of the reaction, the reaction liquid was poured into a large volume of petroleum ether to precipitate a polymer in the form of white powder. After filtration the powder was again dissolved in 50 ml of benzene, and the solution was poured into pertoleum ether to precipitate the refined polymer, which was separated from the solvent and dried for 8 hr at 50° C. under reduced pressure. The dried polymer weighed 3.0 g. By analysis this polymer was confirmed to be poly(p-trimethylsilylstyrene) (abbreviated to PSiSt) of the structure of formula (1), having a weight average molecular weight ($M_w$) of $2.2 \times 10^4$ and a number average molecular weight ($M_n$) of $1.1 \times 10^4$.

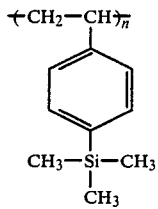

(1)

A resist material solution was prepared by dissolving 0.46 g of PSiSt obtained by the above described process in 10 ml of xylene (to obtain 5 wt% solution) with sufficient stirring, followed by filtration with a 0.2 micrometers filter.

This solution was applied to a silicon substrate and dried in vacuum at room temperature to form a PSiSt film having a thickness of about 0.2 micrometers. The film was subjected to reactive sputter etching with $O_2$ gas to measure the rate of decrease in the film thickness. The etching conditions were 4 sccm, 8 mTorr and 120 W (0.096 W/cm$^2$). In the drawing figure, the curve S-1 represents the result of this test. As can be seen, the etch rate was very low. During an initial phase of the etching operation the etch rate became gradually and slightly lower as the time elapsed, but after the lapse of about 5 min from the start of etching the film thickness bacame almost invariable, meaning that the film was etched no more. In the initial period of about 5 min the film thickness decreased by only 0.022 micrometers. In the PSiSt film etched by reactive sputter etching with $O_2$ gas, the number of trimethylsilyl groups was calculated to be $1 \times 10^{16}$ per 1 cm$^2$.

When an about 1.8 micrometers film of a novolak resin (tradename AZ-1350J of Shipley Co.; this resin will be referred to as "the novolak resin") was etched under the same etching conditions, the rate of decrease in the film thickness was as represented by the curve P in the drawing figure. In this case the film thickness continued to decrease in proportion to the etching time with no change in the rate of decrease, and in 22 min the amount of etch reached 1.5 micrometers. Accordingly it is understood that a PSiSt film in which the number of trimethylsilyl groups is at least $1 \times 10^{16}$ per 1 cm$^2$ can be used as a mask for etching of a layer of the novolak resin.

Next, the sensitivity and resolving power of PSiSt as a resist material in electron-beam lithography were examined by the following test method.

The aforementioned solution of PSiSt was applied by spinning to a silicon substrate and dried for 30 min in vacuum at room temperature to form a PSiSt film having a thickness of 0.138 micrometers. Then patterns of various line and space widths were delineated on the PSiSt film by means of an electron-beam apparatus by varying the dose of irradiation, and development was performed by 1 min treatment with a mixed solution of tetrahydrofuran and ethanol in the proportion of 35:65 by volume, followed by rinsing with isopropyl alcohol for 30 sec. After drying the thickness of the film in the irradiated areas was measured by using a Taylor-Hobson "Tally Step" instrument. The resolving capability of the tested resist material was determined by observation of the respective patterns formed in the exposed and developed film with optical microscope and scanning electron microscope. It was found that the dose of irradiation sufficient to cause gelation of the PSiSt film (will be represented by $D^i$) was 240 microcoulombs/cm$^2$ and the dose that caused the film thickness to reduce to 50% of the initial thickness (will be represented by $D_g^{50}$ was 270 microcoulombs/cm$^2$ it was confirmed that patterns of 0.5 micrometers lines and spaces were perfectly resolved as an evidence of excellence of the PSiSt resist film in resolution.

To examine actual performance of PSiSt as a resist, the novolak resin was applied by spinning to a silicon substrate to form a 1.5 micrometers thick film, followed by prebaking at 250° C. for 1 hr, and then the aforementioned solution of PSiSt was applied by spinning onto the novolak resin film and dried. A submicron pattern was formed in the PSiSt film by the above described exposure and development process. After the development treatment the thickness of the PSiSt film was 0.10 micrometers, and the number of trimethylsilyl groups in the film was calculated to be $4.5 \times 10^{16}$/cm$^2$. With the patterned PSiSt film as a mask the novolak resin film was etched for 25 min by reactive sputter etching with $O_2$ gas under the conditions of 8 mTorr, 4 sccm and 120 W. As a result, a submicron pattern initially delineated in the PSiSt film with irradiation dose of 400 microcoulombs/cm² was transferred with high resolution into the 1.5 micrometers film of the novolak resin. Therefore, the thickness of the PSiSt film was proved to have been sufficient to provide a mask for etching 1.5 micrometers thickness of the novolak resin. The submicron pattern thus formed in the novolak resin film was high in aspect ratio and sufficient in the masking effect for subsequent etching of the substrate.

EXAMPLE 2

In the reactor mentioned in Example 1, 3.5 g (0.02 moles) of SiSt was mixed with 0.8 g (0.005 moles) of anhydrous chloromethylstyrene (abbreviated to CMS), 30 ml of dehydrated benzene and 0.0087 g (0.3 mole% of the total of SiSt and CMS) of BPO, and the mixture was subjected to polymerization reaction for 8 hr at a reflux temperature. Upon completion of the reaction the reaction solution was poured into a large volume of petroleum ether to precipitate a polymer in the form of white powder. This polymer was refined by the method described in Example 1. By analysis this polymer was confirmed to be a copolymer of SiSt with CMS at the copolymerization ratio of 9:1 by mole. This copolymer, i.e. poly(p-trimethylsilylstyrene-chloromethylstyrene) of the structure of formula (2), will be referred to as $P(SiSt_{90}\text{-}CMS_{10})$. The weight average molecular weight $M_w$ of this copolymer was $5.5 \times 10^4$, and $M_n$ was $2.5 \times 10^4$.

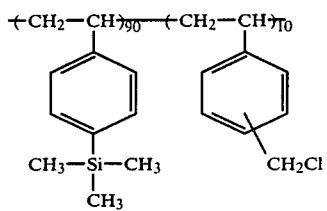

(2)

A resist material solution was prepared by dissolving 0.8 g of $P(SiSt_{90}\text{-}CMS_{10})$ in 17.5 ml of xylene, followed by filtration with a 0.2 micrometers filter. By using this solution a $P(SiSt_{90}\text{-}CMS_{10})$ film having a thickness of about 0.2 micrometers was formed on a silicon substrate, and the film was subjected to reactive sputter etching with $O_2$ gas under the same conditions as in Example 1. In this case the rate of decrease in the film thickness was as represented by the curve S-2 in the drawing figure. After the lapse of about 5 min from the start of etching, the film became almost invariable in its thickness and no longer underwent etching. Until then, the film thickness decreased by only 0.032 micrometers. In the etched film the number of trimethylsilyl groups was calculated to be $1.2 \times 10^{16}/cm^2$. In view of the etch rate of the novolak resin described in Example 1, it is understood that such a film of $P(SiSt_{90}\text{-}CMS_{10})$ can be used as a mask for etching of a layer of the novolak resin. The aforementioned solution of $P(SiSt_{90}\text{-}CMS_{10})$ was applied by spinning to a silicon substrate and dried for 30 min in vacuum at room temperature to form a copolymer film having a thickness of 0.185 micrometers. Then patterns of various line and space widths were delineated on the copolymer film by electron-beam irradiation, and development was performed by 1 min treatment with a mixed solution of isoamyl acetate and ethyl cellosolve in the proportion of 1:4 by volume, followed by rinsing with ethanol for 30 sec. Then the thickness, sensitivity and resolving capability of the copolymer film were examined by the same methods as in Example 1. It was found that $D_g{}^i$ for this copolymer film was 6.5 microcoulombs/cm², and $D_g{}^{50}$ was 13 microcoulombs/cm². The copolymer film was excellent in resolution of the patterns, and it was confirmed that with irradiation dose of 17 microcoulombs/cm² patterns of 0.5 micrometers lines and spaces were perfectly resolved.

In the next experiment the novolak resin was applied by spinning to a silicon substrate to form a 1.5 micrometers thick film, followed by prebaking at 250° C. for 1 hr, and then the aforementioned solution of $P(SiSt_{90}\text{-}CMS_{10})$ was spun onto the novolak resin film and dried. A submicron pattern was formed in the copolymer film by the above described exposure and development process. After the development treatment the thickness of the copolymer film was 0.10 micrometers, and the number of trimethylsilyl groups in the film was calculated to be $3.7 \times 10^{16}/cm^2$. With the patterned copolymer film as a mask the novolak resin was subjected to reactive sputter etching under the same conditions as in Example 1. As a result, a submicron pattern initially formed in the copolymer film with irradiation dose of 14 microcoulombs/cm² was transferred into the 1.5 micrometers film of the novolak resin. Therefore, the thickness of the copolymer film was proved to have been sufficient to provide a mask for etching 1.5 micrometers thickness of the novolak resin.

EXAMPLE 3

In the reactor mentioned in Example 1, 3.5 g (0.02 moles) of SiSt was mixed with 4.3 g (0.03 moles) of anhydrous glycidyl methacrylate (GMA), 50 ml of dehydrated benzene and 0.036 (0.03 mole% of the total of SiSt and GMA) of BPO, and the mixture was subjected to polymerization reaction for 8 hr at a reflux temperature. Upon completion of the reaction, the reaction solution was poured into a large volume of petroleum ether to precipitate a polymer in powder form. This polymer was refined by the method described in Example 1. By analysis $M_w$ of this polymer was $3.5 \times 10^4$ and $M_n$ was $1.8 \times 10^4$, and the polymer was confirmed to be a copolymer of SiSt with GMA at the copolymerization ratio of 4:6 by mole. This copolymer, i.e. (p-trimethylsilylstyrene-glycidyl methacrylate) of the structure of formula (3), will be referred to as $P(SiSt_{40}\text{-}GMA_{60})$.

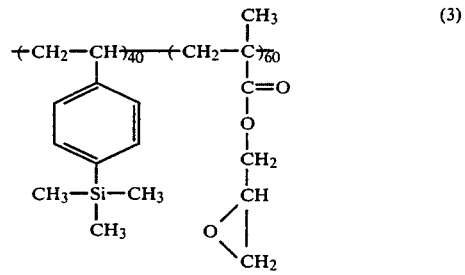

(3)

A solution was prepared by dissolving 2.4 g of $P(SiSt_{40}\text{-}GMA_{60})$ in 28 ml of methyl cellosolve acetate (to obtain 8 wt% solution) with sufficient stirring, followed by filtration with a 0.2 micrometers filter. By using this solution a $P(SiSt_{40}\text{-}GMA_{60})$ film having a thickness of about 0.45 micrometers was formed on a silicon substrate, and the film was subjected to reactive sputter etching with $O_2$ gas under the same conditions as in Example 1. In this case the rate of decrease in the film thickness was as represented by the curve S-3 in the drawing figure. In about 30 min the film thickness decreased by 0.17 micrometers, and thereafter the copolymer film was no longer etched. In this etched film the number of trimethylsilyl groups was calculated to be $3\times10^{16}/cm^2$. In view of the etch rate of the novolak resin described in Example 1, it is understood that such a film of $P(SiSt_{40}\text{-}GMA_{60})$ can be used as a mask for etching of the novolak resin.

The aforementioned solution of $P(SiSt_{40}\text{-}GMA_{60})$ was applied by spinning to a silicon substrate and prebaked in nitrogen gas stream at 80° C. for 30 min to form a copolymer film having a thickness of 0.23 micrometer. Then patterns of various line and space widths were delineated on the copolymer film by electron-beam irradiation, and development was performed by 1 min treatment with a mixed solution of trichloroethylene and acetone in the proportion of 3:1 by volume, followed by rinsing with ethanol for 30 sec. Then the thickness, sensitivity and resolving capability of the copolymer film were examined by the same methods as in Example 1. It was found that $D_g{}^i$ for this copolymer film was 8 microcoulombs/cm$^2$, and $D_g{}^{50}$ was 17 microcoulombs/cm$^2$. The copolymer film was excellent in resolution of the patterns, and it was confirmed that with irradiation dose of 25 microcoulombs/cm$^2$ patterns of 0.5 micrometers lines and spaces were perfectly resolved.

In the next experiment, a submicron pattern formed in a $P(SiSt_{40}\text{-}GMA_{60})$ film with electron-beam irradiation dose of 20 microcoulombs/cm$^2$ was transferred into an underlying 1.5 micrometers film of the novolak resin by reactive sputter etching carried out under the same conditions as in Example 1. After the development treatment the thickness of the patterned copolymer film was 0.20 micrometers, and the number of trimethylsilyl groups in the film was calculated to be $3.6\times10^{16}/cm^2$. The thickness of the copolymer film was proved to have been sufficient for etching 1.5 micrometers thickness of the novolak resin.

COMPARATIVE EXPERIMENT 1

In the reactor mentioned in Example 1, 0.35 g (0.002 moles) of SiSt was mixed with 8.6 g (0.06 moles) of GMA, 50 ml of dehydrated benzene and 0.045 g (0.3 mole% of the total of SiSt and GMA) of BPO, and the mixture was subjected to polymerization reaction for 8 hr at a reflux temperature. Upon completion of the reaction, the reaction solution was poured into a large volume of petroleum ether to precipitate a polymer in powder form. This polymer was refined by the method described in Example 1. By analysis, $M_w$ of the polymer was $2.0\times10^4$ and $M_n$ was $1.2\times10^4$, and the polymer was confirmed to be a copolymer of SiSt with GMA at the copolymerization ratio of 1:30 by mole.

A solution was prepared by dissolving 2.4 g of the obtained copolymer, which will be referred to as $P(SiSt_3\text{-}GMA_{97})$, in 28 ml of methyl cellosolve acetate (to obtain 8 wt% solution) with sufficient stirring, followed by filtration with a 0.2 micrometers filter. By using this solution a $P(SiSt_3\text{-}GMA_{97})$ film having a thickness of about 0.5 micrometers was formed on a silicon substrate, and the film was subjected to reactive sputter etching with $O_2$ gas under the same conditions as in Example 1. In this case the rate of decrease in the film thickness was as represented by the curve R in the drawing figure. The etch rate was considerably higher than in the case of $P(SiSt_{40}\text{-}GMA_{60})$ of Example 3. In 5 min the 0.5 micrometers thick copolymer film was completely etched without exhibiting a decrease in the etch rate. In this copolymer film the number of trimethylsilyl groups was calculated to be $0.8\times10^{16}/cm^2$. From the result of this experiment it is understood that a polymer film in which the number of trimethylsilyl groups is less than $10^{16}/cm^2$ is insufficient in its resistance to dry etching using oxygen to serve as a mask for etching of an underlying organic layer such as a novolak resin layer.

EXAMPLE 4

In the reactor mentioned in Example 1, 7.3 g (0.03 moles) of anhydrous diallyl phthalate (abbreviated to DAP) was mixed with 3.4 g (0.03 moles) of trimethylallylysilane (abbreviated to TMASi), 10 ml of dehydrated benzene and 0.51 g (3 mole% of the total of DAP and TMASi) of BPO, and the mixture was subjected to polymerization reaction for 8 hr at a reflux temperature. Upon completion of the reaction, the reaction solution was poured into a large volume of methanol to precipitate a polymer in the form of white powder. The powder was separated from the solution and dried for 8 hr at 50° C. under reduced pressure to obtain 7.3 g of dry polymer. By analysis, $M_w$ of this polymer was $7.3\times10^4$ and $M_n$ was $8.2\times10^3$. The iodine value of the polymer was 49.2, and the content of Si in the polymer was 4.1% by weight. Therefore, the structure of this DAP-TMASi copolymer was presumed to be as represented by formula (4).

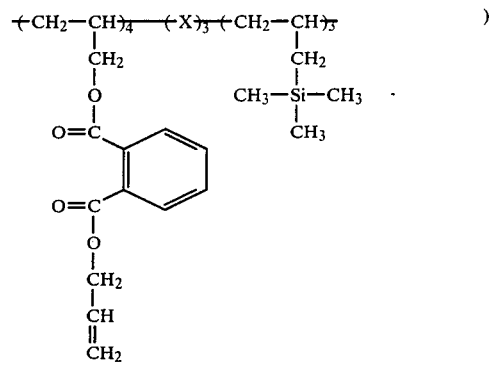

In formula (4) the symbol X represents a unit structure of a cyclic polymer, which is most probably either of the following two formulas.

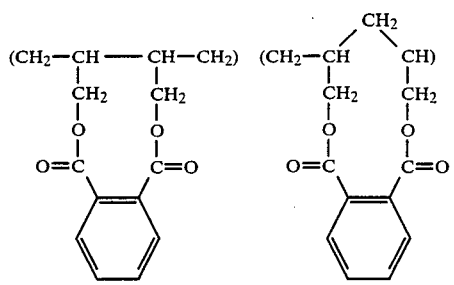

A solution was prepared by dissolving 2.0 g of the obtained copolymer, which will be referred to as $P(DAP_{70}\text{-}TMASi_{30})$, in 20 ml of methyl cellosolve acetate (to obtain 9.1 wt% solution) with sufficient stirring, followed by filtration with a 0.2 micrometers filter. By using this solution a P(DAP$_{70}$-TMASi$_{30}$) film was formed on a silicon substrate, and the film was subjected to reactive sputter etching with O$_2$ gas under the same conditions as in Example 1. In 15 min the film thickness decreased by 0.12 micrometers, but thereafter the film thickness remained almost invariable. The number of trimethylsilyl groups in this etched film was calculated to be 1.3×10$^{16}$/cm$^2$. In view of the etch rate of the novolak resin mentioned in Example 1, it is understood that such a film of P(DAP$_{70}$-TMASi$_{30}$) can be used as a mask for etching of the novolak resin.

The aforementioned solution of P(DAP$_{70}$-TMASi$_{30}$) was applied by spinning to a silicon substrate and dried for 30 min in vacuum at room temperature to form a copolymer film having a thickness of 0.233 micrometers. Then patterns of various line and space widths were delineated on the copolymer film by electron-beam irradiation, and development was performed by 90 sec treatment with a mixed solution of dioxane and methyl cellosolve in the proportion of 3:2 by volume, followed by rinsing with ethanol for 30 sec. Then the thickness, sensitivity and resolving capability of the copolymer film were examined by the same methods as in Example 1. It was found that D$_g{}^i$ for this copolymer film was 3 microcoulombs/cm$^2$, and D$_g{}^{50}$ was 10 microcoulombs/cm$^2$. The copolymer film was excellent in resolution of the patterns, and it was confirmed that with irradiation dose of 10 microcoulombs/cm$^2$ patterns of 0.5 micrometers lines and spaces were perfectly resolved.

In the next experiment a 1.5 micrometers film of the novolak resin was formed on a silicon substrate by the method described in Example 1, and then the aforementioned solution of P(DAP$_{70}$-TMASi$_{30}$) was spun onto the novolak resin film and dried. A submicron pattern was formed in the copolymer film by the aforementioned electron-beam irradiation and development process. After the development treatment the thickness of the copolymer film was 0.14 micrometers, and the number of trimethylsilyl groups in the film was calculated to be 1.48×10$^{16}$/cm$^2$. With the patterned copolymer film as a mask the novolak resin film was subjected to reactive sputter etching under the same conditions as in Example 1. As a result, a submicron pattern initially formed in the copolymer film with irradiation dose of 20 microcoulombs/cm$^2$ was transferred into the 1.5 micrometers film of the novolak resin, so that the thickness of the copolymer film was proved to have been sufficient to provide a mask for etching 1.5 micrometers thickness of the novolak resin.

EXAMPLE 5

In the process of preparing the copolymer of Example 4, the quantities of DAP monomer and TMASi monomer were varied to 7.3 g (0.03 moles) and to 4.5 g (0.04 moles), respectively. In this case the refined and dried product weighed 7.6 g. By analysis, M$_w$ of the obtained copolymer was 5.5.×10$^4$ and M$_n$ was 1.0×10$^4$. The iodine value of this copolymer was 42.3, and the content of Si in the copolymer was 7.8% by weight. Therefore, the structure of this DAP-TMASi copolymer was presumed to be as represented by formula (5).

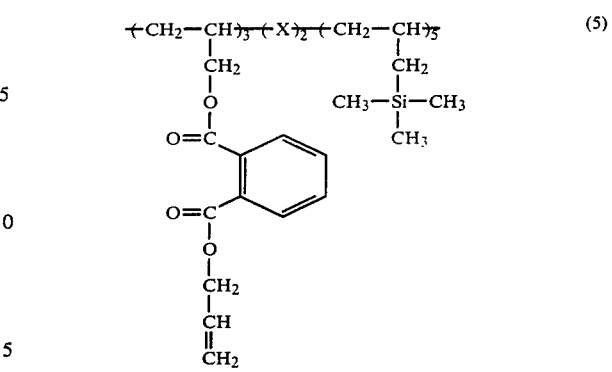

In formula (5) the symbol X represents the unit structure described in Example 4.

A solution was prepared by dissolving 1.7 g of the obtained copolymer, which will be referred to as P(DAP$_{50}$-TMASi$_{50}$), in 22 ml of methyl cellosolve acetate (to obtain 7 wt% solution) with sufficient stirring, followed by filtration with a 0.2 micrometers filter. By using this solution a film of P(DAP$_{50}$-TMASi$_{50}$) was formed on a silicon substrate, and the film was subjected to reactive sputter etching with O$_2$ gas under the same conditions as in Example 1. In 10 min the film thickness decreased by 0.06 micrometers, but thereafter the film thickness remained almost invariable. The number of trimethylsilyl groups in this etched film was calculated to be 1.2×10$^{16}$/cm$^2$. In view of the etch rate of the novolak resin mentioned in Example 1, it is understood that such a film of P(DAP$_{50}$-TMASi$_{50}$) can be used as a mask for etching of the novolak resin.

Using the same solution of P(DAP$_{50}$-TMASi$_{50}$), a copolymer film having a thickness of 0.24 micrometers was formed on a silicon substrate by the same method as in Example 4. Then patterns of various line and space widths were delineated on the copolymer film by the same electron-beam irradiation and development process as in Example 4, and the thickness, sensitivity and resolving capability of this copolymer film were examined by the same methods as in Example 1. It was found that D$_g{}^i$ for this copolymer film was 7 microcoulombs/cm$^2$, and D$_g{}^{50}$ was 13 microcoulombs/cm$^2$. The copolymer film was excellent in resolution of the patterns, and it was confirmed that with irradiation dose of 15 microcoulombs/cm$^2$ patterns of 0.5 micrometers lines and spaces were perfectly resolved.

In the next experiment a 1.5 micrometers film of the novolak resin was formed on a silicon substrate by the method described in Example 1, and then the aforementioned solution of P(DAP$_{50}$-TMASi$_{50}$) was spun onto the novolak resin film and dried. A submicron pattern was formed in the copolymer film by the aforementioned electron-beam irradiation and development process. After the development treatment the thickness of the copolymer film was 0.15 micrometers, and the number of trimethylsilyl groups in the film was calculated to be 3×10$^{16}$/cm$^2$. With the patterned copolymer film as a mask the novolak resin film was subjected to reactive sputter etching under the same conditions as in Example 1. As a result, a submicron pattern initially formed in the copolymer film with irradiation dose of 20 microcoulombs/cm$^2$ was transferred into the 1.5 micrometers film of the novolak resin, so that the thickness of the copolymer film was proved to have been sufficient to provide a mask for etching the 1.5 micrometers thickness of the novolak resin.

EXAMPLE 6

In the reaction mentioned in Example 1, mixture of 7.3 g (0.03 moles) of diallyl terephthalate (abbreviated to DATP), 3.4 g (0.03 moles) of TMASi, 10 ml of dehydrated benzene and 0.51 g (3 mole% of the total of DATP and TMASi) of BPO was subjected to polymerization reaction for 8 hr at a reflux temperature. Upon completion of the reaction, the reaction liquid was poured into a large volume of methanol to precipitate a polymer in powder form. The polymer was refined and dried in the same manner as in Example 4 to obtain 8.0 g of dry polymer. By analysis, $M_w$ of the thus obtained copolymer was $8.0 \times 10^4$ and $M_n$ was $9.0 \times 10^3$. The iodine value of the copolymer was 65.7, and the content of Si in the copolymer was 5.8% by weight. Therefore, the structure of this DATP-TMASi copolymer was presumed to be as represented by formula (6).

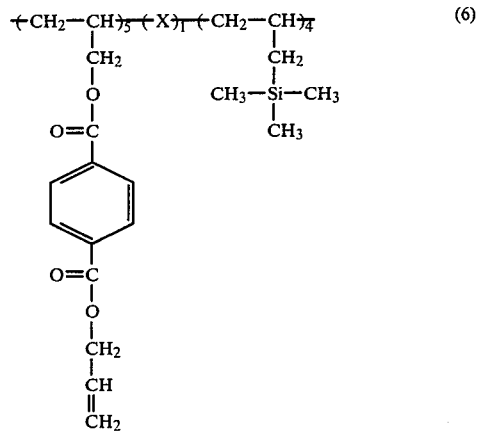

In formula (6) the symbol X represents a unit structure of a cyclic polymer, which is most probably either of the following two formulas.

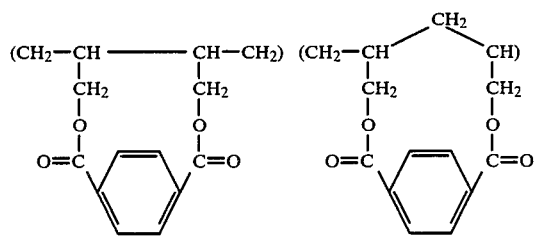

A solution was prepared by dissolving 2.0 g of the obtained copolymer, which will be referred to as P(DATP$_{60}$-TMASi$_{40}$), in 20 ml of methyl cellosolve acetate (to obtain 9.1 wt% solution) with sufficient sitrring, followed by filtration with a 0.2 micrometers filter. By using this solution a film of P(DATP$_{60}$-TMASi$_{40}$) was formed on a silicon substrate, and the film was subjected to reactive sputter etching with O$_2$ gas under the same conditions as in Example 1. In 15 min the film thickness decreased by 0.10 micrometers, but thereafter the film thickness remained almost invariable. The number of trimethylsilyl groups in this etched copolymer film was calculated to be $1.5 \times 10^{16}$/cm$^2$. In view of the etch rate of the novolak resin mentioned in Example 1, it is understood that such a film of P(DATP$_{60}$-TMASi$_{40}$) can be used as a mask for etching of the novolak resin.

Using the same solution a film of P(DATP$_{60}$-TMASi$_{40}$) was formed on a silicon substrate, and the sensitivity and resolving capability of the film were examined by the same methods as in Example 4. It was found that $D_g{}^i$ for this copolymer film was 2.0 microcoulombs/cm$^2$, and $D_g{}^{50}$ was 5.0 microcoulombs/cm$^2$. The copolymer film was excellent in resolution of the patterns, and it was confirmed that with irradiation dose of 6.0 microcoulombs/cm$^2$ patterns of 0.5 micrometers lines and spaces were perfectly resolved.

In the next experiment a 1.0 micrometer film of the novolak resin was formed on a silicon substrate by the method described in Example 1, and then the solution of P(DATP$_{60}$-TMASi$_{40}$) was spun onto the novolak resin film and dried. A submicron pattern was formed in the copolymer film by the same electron-beam irradiation and development process as in Example 4 with irradiation dose of 7.0 microcoulombs/cm$^2$. After the development treatment the thickness of the copolymer film was 0.20 micrometers, and the number of trimethylsilyl groups in the film was calculated to be $3.1 \times 10^{16}$/cm$^2$. With the patterned copolymer film as a mask, the novolak resin film was subjected to reactive sputter etching in the same manner as in Example 1 to result in that the submicron pattern was transferred into the novolak resin film. Therefore, the thickness of the copolymer film was proved to have been sufficient to provide a mask for etching 1.0 micrometer thickness of the novolak resin.

COMPARATIVE EXPERIMENT 2

In the reactor mentioned in Example 1, a mixture of 7.3 g (0.03 moles) of DAP, 0.6 g (0.005 moles) of TMASi, 10 ml of dehydrated benzene and 0.30 g (3 mole% of the total of DAP and TMASi) of BPO was subjected to polymerization reaction for 8 hr at a reflux temperature. Upon completion of the reaction, the reaction solution was poured into a large volume of methanol to precipitate a polymer in powder form. The polymer was refined and dried in the same manner as in Example 4 to obtain 7.0 g of dry polymer. By analysis, $M_w$ of the obtained copolymer was $5.5 \times 10^3$ and $M_n$ was $3.9 \times 10^3$. The copolymer had an iodine value of 46.4 and contained 0.65% by weight of Si. Therefore, the structure of this DAP-TMASi copolymer was presumed to be as represented by formula (4A). In formula (4A) the symbol X represents the unit structure described in Example 4.

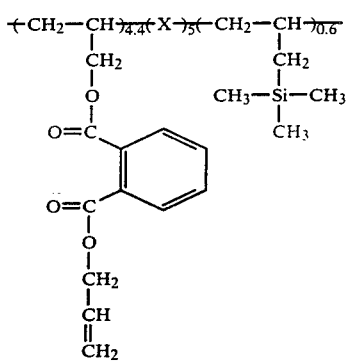

A solution was prepared by dissolving 2.0 g of the obtained copolymer, which will be referred to as P(DAP$_{94}$-TMASi$_6$), in 20 ml of methyl cellosolve acetate, followed by filtration with a 0.2 micrometers filter. By using this solution a film of P(DAP$_{94}$-TMASi$_6$) having a thickness of 0.45 micrometers was formed on a silicon substrate, and the film was subjected to reactive sputter etching under the same conditions as in Example 1. In 5 min the copolymer film was etched to the extent of the 4.5 micrometers thickness without exhibiting a decrease in the etch rate. In this copolymer film the number of trimethylsilyl groups was calculated to be $7.5 \times 10^{15}/cm^2$. From the result of the test it is understood that a copolymer film in which the number of trimethylsilyl groups is less than $10^{16}/cm^2$ is insufficient in its resistance to dry etching using oxygen to serve as a mask for etching of an underlying organic layer such as a novolak resin layer.

EXAMPLE 7

In the reactor mentioned in Example 1, a mixture of 10.6 g (0.1 moles) of a novolak-type phenolic resin (containing no photosensitive agent) and 4.8 g (0.03 moles) of hexamethyldisilazane was gradually heated from room temperature up to 150° C. and maintained at 150° C. for 3–4 hr so as to undergo copolymerization reaction. The reaction was terminated after confirming that the reaction system in the flask no longer emitted the odor of ammonia. The content of Si in the obtained copolymer was determined to be 6.1% by weight, and the copolymer was subjected to infrared absorption spectrum analysis. From the analytical results the structure of this copolymer was presumed to be as represented by formula (7).

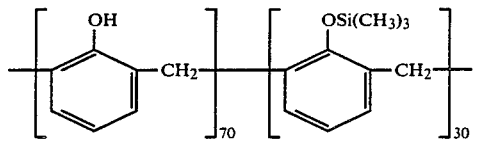

A solution was prepared by dissolving 2.0 g of the obtained copolymer, namely, trimethylsilyl-substituted phenolic resin which will be referred to as P(PhOH$_{70}$-PhOSi$_{30}$), and 0.5 g of 3,3-diazido biphenyl sulfone in 20 ml of cellosolve acetate (to obtain 8.9 wt% solution) with sufficient stirring, followed by filtration with a 0.2 micrometers filter. By using this solution a film of P(PhOH$_{70}$-PhOSi$_{30}$) was formed on a silicon substrate, and the film was subjected to reactive sputter etching with O$_2$ gas under the same conditions as in Example 1. In 5 min the film thickness decreased by 0.13 micrometers, but thereafter the film thickness remained almost invariable. The number of trimethylsilyl groups in this etched copolymer film was calculated to be $1.6 \times 10^{16}/cm^2$. In view of the etch rate of the novolak resin (AZ-1350J) mentioned in Example 1, it is understood that such a film of this copolymer can be used as a mask for etching of the novolak resin.

In the next experiment a 1.0 micrometer film of the novolak resin (AZ-1350J) was formed on a silicon substrate by the method described in Example 1, and then the solution of P(PhOH$_{70}$-PhOSi$_{30}$) was spun onto the novolak resin film and dried. A submicron pattern was formed in the copolymer film by electron-beam irradiation and development, which was 1 min treatment with methyl cellosolve acetate followed by rinsing with isopropyl alcohol for 30 sec. The irradiation dose was 300 microcoulombs/cm$^2$. After the development treatment the thickness of the copolymer film was 0.22 micrometers, and the number of trimethylsilyl groups in the film was calculated to be $2.8 \times 10^{16}/cm^2$. Then, the submicron pattern of negative type was accurately transferred from the copolymer film into the novolak resin film by reactive sputter etching with O$_2$. Accordingly the thickness of the copolymer film was sufficient to provide a mask for etching 1.0 micrometer thickness of the novolak resin.

EXAMPLE 8

The polymerization process in Example 7 was repeated by increasing the quantity of hexamethydisilazane to 8.0 g (0.05 moles), and the obtained copolymer was subjected to chemical analysis and infrared absorption spectrum analysis. In this case the content of Si in the copolymer was 8.0% by weight, and the structure of the copolymer was presumed to be as represented by formula (8).

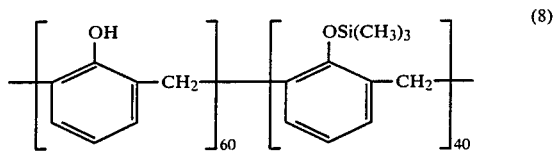

A solution was prepared by dissolving 2.0 g of the obtained copolymer, namely, trimethylsilyl-substituted phenolic resin which will be referred to as P(PhOH$_{60}$-PhOSi$_{40}$), and 0.5 g of 3,3-diazido biphenyl sulfone in 20 ml of cellosolve acetate (to obtain 8.9 wt% solution), followed by filtration with a 0.2 micrometers filter. By using this solution a film of P(PhOH$_{60}$-PhOSi$_{40}$) was formed on a silicon substrate, and the film was subjected to reactive sputter etching with O$_2$ under the same conditions as in Example 1. In 5 min the film thickness decreased by 0.10 micrometers, but thereafter the film thickness remained almost invariable. The number of trimethylsilyl groups in this etched copolymer film was calculated to be $1.7 \times 10^{16}/cm^2$. In view of the etch rate of the novolak resin (AZ-1350J) mentioned in Example 1, it is understood that such a film of P(PhOH$_{60}$-PhOSi$_{40}$) can be used as a mask for etching of the novolak resin.

In the next experiment a 1.0 micrometer film of the novolak resin (AZ-1350J) was formed on a silicon substrate by the method described in Example 1, and then the solution of P(PhOH$_{60}$-PhOSi$_{40}$) was spun onto the novolak resin film and dried. A submicron pattern was formed in the copolymer film by the electron-beam irradiation and development process mentioned in Example 7. In this case the irradiation dose was 350 microcoulombs/cm$^2$. After the development treatment the thickness of the copolymer film was 0.20 micrometers, and the number of trimethylsilyl groups in the film was 0.20 micrometers, and the number of trimethylsilyl groups in the film was $3.3 \times 10^{16}$/cm$^2$. Then the submicron pattern was accurately transferred from the copolymer film into the novolak resin film by reactive sputter etching with O$_2$. Accordingly the thickness of the copolymer film was sufficient to provide a mask for etching 1.0 micrometer thickness of the novolak resin.

COMPARATIVE EXPERIMENT 3

In the polymerization process in Example 7, the quantity of hexamethyldisilazane was decreased to 1.2 g (0.008 moles). Consequently the content of Si in the obtained copolymer decreased to 1.6% by weight, and the structure of the obtained copolymer was presumed to be as represented by formula (7A).

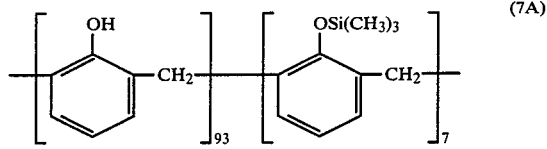

A solution was prepared by dissolving 2.0 g of this copolymer, which will be reffered to as P(PhOH$_{93}$-PhOSi$_7$), and 0.5 g of 3,3-diazido biphenyl sulfone in 20 ml of cellosolve acetate (to obtain 6.2 wt% solution), followed by filtration with a 0.2 micrometers filter. By using this solution a film of P(PhOH$_{93}$-PhOSi$_7$) having a thickness of 0.28 micrometers was formed on a silicon substrate, and the film was subjected to reactive sputter etching under the same conditions as in Example 1. In 2 min, the copolymer film was etched to the extent of its 0.28 micrometers thickness without exhibiting a decrease in the etch rate. In this copolymer film the number of trimethylsilyl groups was calculated to be $9.2 \times 10^{15}$/cm$^2$. Therefore, it is understood that a copolymer film in which the number of trimethylsilyl groups is less than $10^{16}$/cm$^2$ is insufficient in its resistance to dry etching using oxygen to serve as a mask for etching of an underlying organic layer such as a novolak resin layer.

EXAMPLE 9

In the reactor mentioned in Example 1, a mixture of 3.5 g of anhydrous p-trimethylsilylstyrene (abbreviated to ESiSt), 30 ml of dehydrated benzene and 0.014 g of BPO was subjected to polymerization reaction for 8 hr at a reflux temperature, and a polymer formed by the reaction was refined and dried by the same methods as in Example 4. The polymer was poly(p-triethylsilylstyrene), which will be referred to as PESiSt, represented by formula (9). By analysis, M$_w$ of this polymer was $3.0 \times 10^4$, and M$_n$ was $1.7 \times 10^4$.

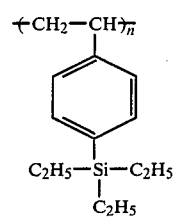

A solution was prepared by dissolving 1.0 g of PESiSt in 20 ml of xylene (to obtain 4.8 wt% solution) with sufficient stirring, followed by filtration with a 0.2 micrometers filter. By using this solution a film of PESiSt was formed on a silicon substrate, and the film was subjected to reactive sputter etching with O$_2$ under the same conditions as in Example 1. In 5 min the film thickness decreased by 0.032 micrometers, but thereafter the film thickness remained almost invariable. The number of triethylsilyl groups in this etched polymer film was calculated to be $1.0 \times 10^{16}$/cm$^2$. In view of the etch rate of the novolak resin mentioned in Example 1, it is understood that such a film of PESiSt can be used as a mask for etching of the novolak resin.

The aforementioned solution of PESiSt was applied by spinning to a silicon substrate and heated in nitrogen gas stream at 100° C. for 30 min to thereby form a polymer film having a thickness of 0.190 micrometers. The patterns of various line and space widths were delineated on the polymer film by electron-beam irradiation, and development was performed by 1 min treatment with a mixed solution of tetrahydrofuran and ethanol in the proportion of 4:1 by volume, followed by rinsing with isopropyl alcohol for 30 sec. The sensitivity and resolving capability of the polymer film were examined in the same manner as in Example 1. It was found that D$_g^i$ for this polymer film was 210 microcoulombs/cm$^2$ and D$_g^{50}$ was 240 microcoulombs/cm$^2$. The polymer film was excellent in resolution of the patterns, and it was confirmed that with irradiation dose of 270 microcoulombs/cm$^2$ submicron patterns were perfectly resolved.

In the next experiment a film of PESiSt was formed on a 1.5 micrometers film of the novolak resin, and a submicron pattern was formed in the polymer layer with irradiation dose of 380 microcoulombs/cm$^2$. After the aforementioned development treatment the thickness of the polymer film was 0.15 micrometers, and the number of triethylsilyl groups in the polymer film was $5.0 \times 10^{16}$/cm$^2$. By reactive sputter etching with O$_2$, the submicron pattern was accurately transferred from the polymer film to the novolak resin film. Accordingly the thickness of the PESiSt film was sufficient to provide a mask for etching 1.5 micrometers thickness of the novolak resin.

EXAMPLE 10

In a three-neck flask having a capacity of 500 ml, 26 g (0.2 moles) of 2-hydroxyethyl methacrylate (abbreviated to HEMA) and 16 g of pyridine were dissolved in 200 ml of carbon tetrachloride. At room temperature, 107.5 g (0.2 moles) of trimethylchlorosilane was slowly dropped into the solution in the flask to complete the addition of the entire amount in 30 min. During this process precipitation of hydrochloric acid salt of pyridine took place. After filtration, carbon tetrachloride in the reaction liquid was distilled out by using an evaporater, and the remaining liquid was distilled under reduced pressure to obtain 37 g of 2-trimethylsiloxyethyl methacrylate (abbreviated to HEMA-Si).

In a 100 ml three-neck flask, a mixture of 5.6 g (0.03 moles) of HEMA-Si, 30 ml of benzene and 0.021 g of BPO was subjected to polymerization reaction for 8 hr at a reflux temperature. Thereafter benzene was distilled out by using an evaporater, and the remaining product was dried for 8 hr at 80° C. under reduced pressure. Obtained as the result was 4.3 g of poly(2-trimethylsiloxyethyl methacrylate), which will be referred to as P(HEMA-Si), represented by formula (10). By analysis, $M_w$ of this polymer was $18 \times 10^4$, and $M_n$ was $8.2 \times 10^4$.

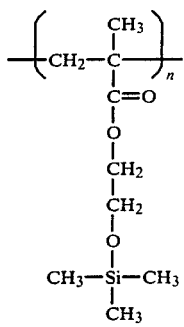

(10)

A solution was prepared by dissolving 2 g of P(HEMA-Si) in 23 ml of methyl cellosolve acetate (to obtain 8 wt% solution), followed by filtration with a 0.2 micrometers filter. By using this solution a film of P(HEMA-Si) was formed on a silicon substrate, and the film was subjected to reactive sputter etching with $O_2$ under the same conditions as in Example 1. In 5 min the film thickness decreased by 0.039 micrometers, but thereafter the film thickness remained almost invariable. The number of trimethylsilyl groups in this etched polymer film was calculted to be $1.5 \times 10^{16}/cm^2$. In view of the etch rate of the novolak resin mentioned in Example 1, it is understood that such a film of P(HEMA-Si) can be used as a mask for etching of the novolak resin.

In the next experiment a 1.5 micrometers film of the novolak resin was formed on a silicon substrate by the method described in Example 1, and the aforementioned solution of P(HEMA-Si) was spun onto the novolak resin film and heated in nitrogen gas stream at 80° C. for 30 min to thereby form a P(HEMA-Si) film. A submicron pattern was formed in the polymer film by electron-beam irradiation and development, which was 1 min treatment with a mixed solution of butyl cellosolve and cyclohexane in the proportion of 1:19 by volume followed by 30 sec rinsing with cyclohexane. The irradiation dose was 50 microcoulombs/cm². After the development treatment the thickness of the polymer film was 0.17 micrometers, and the number of trimethylsilyl groups in the film was $6.6 \times 10^{16}/cm^2$. Then the submicron pattern of positive type was accurately transferred from the P(HEMA-Si) film into the novolak resin film by reactive sputter etching with $O_2$. Accordingly the thickness of the P(HEMA-Si) film was sufficient to provide a mask for etching 1.5 micrometers thickness of the novolak resin.

EXAMPLE 11

In a 100 ml three-neck flask, a mixture of 3.7 g (0.02 moles) of HEMA-Si, 2.0 g (0.02 moles) of methyl methacrylate (abbreviated to MMA), 30 ml of benzene and 0.028 g of BPO was subjected to polymerization reaction for 8 hr at a reflux temperature. A polymer formed by the reaction was refined and dried by the methods described in Example 1 to obtain 4.0 g of dry polymer. By analysis, $M_w$ of this polymer was $16 \times 10^4$, and $M_n$ was $8.1 \times 10^4$. The polymer was confirmed to be a copolymer of HEMA-Si with MMA, and the copolymerization ratio was presumed to be 1:1, so that the structure of the copolymer is represented by formula (11).

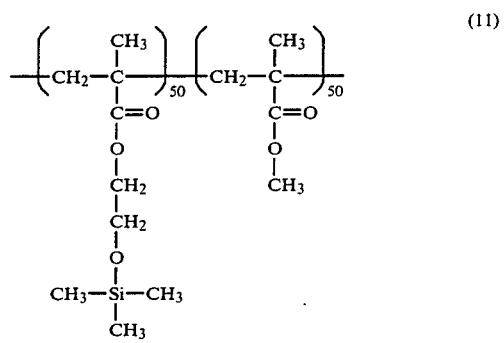

(11)

A solution was prepared by dissolving 2.0 g of this copolymer, which will be referred to as P(HEMASi$_{50}$-MMA$_{50}$), in 23 ml of methyl cellosolve acetate. By using this solution a film of P(HEMASi$_{50}$-MMA$_{50}$) was formed on a silicon substrate, and the film was subjected to reactive sputter etching with $O_2$ under the same conditions as in Example 1. In 5 min the film thickness decreased by 0.045 micrometers, but thereafter the film thickness remained almolst invariable. The number of trimethylsilyl groups in the etched film was calculated to be $1.2 \times 10^{16}/cm^2$. In view of the etch rate of the novolak resin mentioned in Example 1, it is understood that such a film of P(HEMASi$_{50}$-MMA$_{50}$) can be used as a mask for etching of the novolak resin.

In the next experiment a 1.5 micrometers film of the novolak resin was formed on a silicon substrate by the method described in Example 1, and the aforementioned solution of P(HEMASi$_{50}$-MMA$_{50}$) was spun onto the novolak resin film and heated in nitrogen gas stream at 80° C. for 30 min to thereby form a film of this copolymer. A submicron pattern was formed in the copolymer film by electron-beam irradiation and development, which was 1 min treatment with a mixed solution of methylisobutyl ketone and cyclohexane in the proportion of 1:1 by volume followed by 30 sec rinsing with cyclohexane. The irradiation dose was 100 microcoulombs/cm². After the development treatment the thickness of the copolymer film was 0.20 micrometers, and the number of trimethylsilyl groups in the copolymer film was $5.1 \times 10^{16}/cm^2$. Then the submicron pattern of positive type was accurately transferred from the copolymer film to the novolak resin film by reactive sputter etching with $O_2$. Accordingly the thickness of the P(HEMASi$_{50}$-MMA$_{50}$) film was sufficient to provide a mask for etching 1.5 micrometers thickness of the novolak resin.

COMPARATIVE EXPERIMENT 4

In the copolymerization process of Example 11, the quantity of HEMA-Si was decreased to 0.37 g (0.002 moles) and the quantity of BPO to 0.015 g. Obtained as the result was 1.5 g of a copolymer of HEMA-Si with MMA. In this case copolymerization ratio of HEMA-Si to MMA was judged to be 1:19. As to the molecular weight of this copolymer, $M_w$ was $10 \times 10^4$ and $M_n$ was $4.6 \times 10^4$.

A solution was prepared by dissolving 1 g of this copolymer, which will be referred to as P(HEMASi$_5$-MMA$_{95}$), in 9 ml of methyl cellosolve. By using this solution a film of P(HEMASi$_5$-MMA$_{95}$) having a thickness of 0.25 micrometers was formed on a silicon substrate, and the film was subjected to reactive sputter etching under the same conditions as in Example 1. In 5 min, the copolymer film was etched to the extent of its 0.25 micrometers thickness without exhibiting a decrease in the etch rate. The number of trimethylsilyl groups in this copolymer film was calculated to be $8.4 \times 10^{15}/cm^2$. Therefore, it is understood that a copolymer film in which the number of trimethylsilyl groups is less than $10^{16}/cm^2$ is insufficient in its resistance to dry etching using oxygen to serve as a mask for etching of an underlying organic layer such as a novolak resin layer.

EXAMPLE 12

In the reactor mentioned in Example 1, a mixture of 4.8 g (0.02 moles) of p-dimethylphenylsilylstyrene (abbreviated to PhSiSt), 50 ml of dehydrated benzene and 0.036 g of BPO was subjected to polymerization reaction for 8 hr at a reflux temperature. Upon completion of the reaction, the reaction liquid was poured into a large volume of methanol to precipitate a polymer. This polymer was refined and dried by the methods described in Example 1 to obtain 3.2 g of dry polymer. The polymer was poly(p-dimethylphenylsilylstyrene), which will be referred to as PPhSiSt, represented by formula (12). By analysis, $M_w$ of this polymer was $1.9 \times 10^4$ and $M_n$ was $6.3 \times 10^3$.

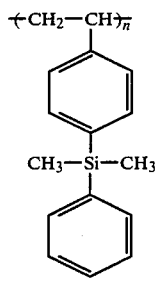
(12)

A solution was prepared by dissolving 2.4 g of PPhSiSt in 28 ml of methyl cellosolve acetate (to obtain 8 wt% solution) with sufficient stirring, followed by filtration with a 0.2 micrometers filter. By using this solution a film of PPhSiSt was formed on a silicon substrate, and the film was subjected to reactive sputter etching with $O_2$ under the same conditions as in Example 1. In 5 min the film thickness decreased by 0.040 micrometers, but thereafter the film thickness remained almost invariable. The number of dimethylphenylsilyl groups in this etched film was calculated to be $1.2 \times 10^{16}/cm^2$. In view of the etch rate of the novolak resin mentioned in Example 1, it is understood that such a film of PPhSiSt can be used as a mask for etching of the novolak resin.

In the next experiment a 1.5 micrometers film of the novolak resin was formed on a silicon substrate by the method described in Example 1, and the aforementioned solution of PPhSiSt was spun onto the novolak resin film and heated in nitrogen gas stream at 100° C. for 30 min to thereby form a film of the polymer. A submicron pattern was formed in the PPhSiSt film by electron-beam irradiation and development, which was 1 min treatment with a mixed solution of methylethyl ketone and isopropyl alcohol in the proportion of 5:1 by volume followed by 30 sec rinsing with isopropyl alcohol. The irradiation dose was 500 micrometers/cm$^2$. After the development treatment the thickness of the polymer film was 0.18 micrometers, and the number of dimethylphenylsilyl groups in the polymer film was calculated to be $5.5 \times 10^{16}/cm^2$. Then the submicron pattern was accurately transferred from the PPhSiSt film into the novolak resin film by reactive sputter etching with $O_2$. Accordingly the thickness of the PPhSiSt film was sufficient to provide a mask for etching 1.5 micrometers thickness of the novolak resin.

COMPARATIVE EXPERIMENT 5

In the reactor mentioned in Example 1, a mixture of 1.4 g (0.006 moles) of PhSiSt, 7.0 g (0.05 moles) of GMA, 50 ml of dehydrated benzene and 0.041 g of BPO was subjected to polymerization reaction for 8 hr at a reflux temperature. Upon completion of the reaction, the reaction liquid was poured into a large volume of petroleum ether to precipitate a polymer. This polymer was refined and dried by the methods mentioned in Example 4. By analysis, $M_w$ of this polymer was $9.2 \times 10^3$ and $M_n$ was $4.3 \times 10^3$. The polymer was a copolymer of PhSiSt with GMA at the copolymerization ratio of 1:9 by mole.

A solution was prepared by dissolving 2.4 g of the PhSiSt-GMA copolymer in 28 ml of methyl cellosolve acetate (to obtain 8 wt% solution) followed by filtration with a 0.2 micrometers filter. By using this solution a film of the copolymer having a thickness of 0.2 micrometers was formed on a silicon substrate, and the film was subjected to reactive sputter etching under the same conditions as in Example 1. In 5 min, the copolymer film was etched to the extent of its 0.2 micrometers thickness without exhibiting a decrease in the etch rate. The number of dimethylphenylsilyl groups in this copolymer film was calculated to be $9.5 \times 10^{15}/cm^2$. Therefore, it is understood that a copolymer film in which the number of dimethylphenylsilyl groups is less than $10^{16}/cm^2$ is insufficient in its resistance to dry etching using oxygen to serve as a mask for etching of an underlying organic polymer layer such as a novolak resin layer.

EXAMPLE 13

In the reactor mentioned in Example 1, a mixture of 5.0 g (0.02 moles) of 3-trimethoxysilylpropyl methacrylate (abbreviated to SiMA), 2.8 g (0.02 moles) of GMA refined by distillation over calcium hydride, 50 ml of dehydrated benzene and 0.028 g of BPO was subjected to polymerization reaction for 8 hr at a reflux temperature. Upon completion of the reaction, the reaction liquid was poured into a large volume of petroleum ether to precipitate a polymer in the form of white powder, and the polymer was refined and dried by the same methods as in Example 1 to obtain 7.3 g of dry polymer. Analysis of this polymer gave the following values.

Infrared Absorption Spectrum (KBr): 1730 cm$^{-1}$, 1250 cm$^{-1}$, 1090 cm$^{-1}$.

Magnetic Resonance Spectrum (CDCl$_3$, TMS): δ0.5-1.3 (br. 6H, 2CH$_3$), 1.4-2.2 (br, 10H, 5CH$_2$), 2.5-2.7 (br, 1H, Epoxy), 2,7-2.9 (br, 1H, Epoxy), 3.1-3.3 (br, 1H, Epoxy), 3.55 (S, 9H, 3CH$_3$O), 3.8-4.0 (br, 2H, CH$_2$OCO), 4.1-4.4 (br, 2H, CH$_2$OCO).

Molecular Weight and Molecular Weight Distribution

M$_w$ was 10.9×10$^4$, M$_n$ was 5.1×10$^4$, M$_w$/M$_n$ was 2.14.

Content of Si: 7.30% by weight

From these analytical values, the polymer was confirmed to be a copolymer of SiMA having the structure represented by formula (13). This copolymer will be referred to as P(SiMA$_{50}$-GMA$_{50}$).

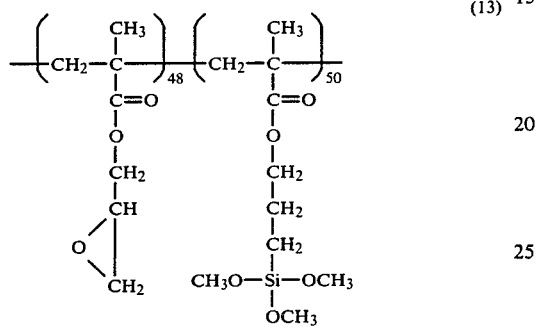

(13)

A solution was prepared by dissolving 1.0 g of P(SiMA$_{50}$-GMA$_{50}$) in 19 ml of methyl cellosolve acetate (to obtain 5 wt% solution) with sufficient stirring, followed by filtration with a 0.2 micrometers filter. The novolak resin (AZ-1350J) was applied by spinning to a silicon substrate and heated at 200° C. for 1 hr to thereby form a 1.5 micrometers film. After cooling of the substrate to room temperature the solution of P(SiMA$_{50}$-GMA$_{50}$) was spun onto the novolak resin film and heated in nitrogen gas stream at 80° C. for 30 min to thereby form a P(SiMA$_{50}$-GMA$_{50}$) film of which the thickness was estimated to be 0.22 micrometers. A submicron pattern was formed in the copolymer film by electron-beam irradiation with irradiation dose of 0.4 micrometers/cm$^2$ and development, which was performed by 1 min treatment with a mixed solution of trichloroethylene and acetone in the proportion of 3:1 by volume followed by 30 sec rinsing with ethanol. Then the submicron pattern was accurately transferred from the copolymer film into the novolak resin film by reactive sputter etching with O$_2$ gas which was carried out for 25 min under the same conditions as in Example 1.

What is claimed is:

1. A method of forming a pattern in the manufacture of microelectronic devices, the method comprising the steps of:
  forming an organic polymer layer which can be etched by dry etching on a substrate to ultimately be etched;
  forming a resist film directly on said organic polymer layer, the material of said resist film being a polymer comprising a trialkylsilyl group and being formed by using a monomer selected from the group consisting of monomers of formula (I), monomers of formula (II), and monomers of formula (III), and forming a desired pattern in said resist film by using a lithography technique such that the number of said substituted silyl groups in the patterned resist film is at least 1×10$^{16}$ per 1 cm$^2$;
  etching said organic polymer layer by a dry etching technique with the patterned resist film as a mask; and
  etching said substrate with the unetched areas of said organic polymer layer as a mask;
  wherein formula (I) is:

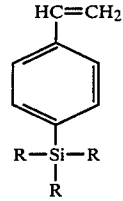

formula (II) is

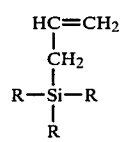

and formula (III) is

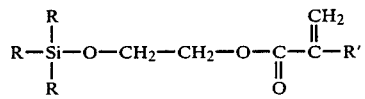

where R represents a lower alkyl group, and R' represents a hydrogen atom or a lower alkyl group.

2. A method according to claim 1, wherein the material of said resist film is poly(trialkylsilylstyrene).

3. A method according to claim 2, wherein said poly(trialkylsilylstyrene) is selected from the group consisting of poly(trimethylsilylstyrene) and poly(triethylsilylstyrene).

4. A method according to claim 1, wherein the material of said resist film is a copolymer of trialkylsilylstyrene with an ethylenic unsaturated monomer not having said substituted silyl group.

5. A method according to claim 4, wherein said ethylenic unsaturated monomer is selected from the group consisting of chloromethylstyrene and glycidyl methacrylate.

6. A method according to claim 5, wherein said trialkylsilylstyrene is trimethylsilylstyrene.

7. A method according to claim 1, wherein the material of said resist film is a copolymer of trimethylallylsilane with another monomer selected from the group consisting of diallyl phthalate and diallyl terephthalate.

8. A method according to claim 1, wherein the material of said resist film is poly(2-trimethylsiloxyethyl methacrylate).

9. A method according to claim 1, wherein the material of said resist film is a copolymer of 2-trimethylsiloxyethyl methacrylate with an ethylenic unsaturated monomer not having said substituted silyl group.

10. A method according to claim 9, wherein said ethylenic unsaturated monomer is methyl methacrylate.

11. A method of forming a pattern in the manufacture of microelectronic devices, the method comprising the steps of:
  forming an organic polymer layer which can be etched by dry etching on a substrate to ultimately be etched;

forming a resist film directly on said organic polymer layer, the material of said resist film being a polymer comprising a trialkoxysilyl group and being formed by using a monomer of

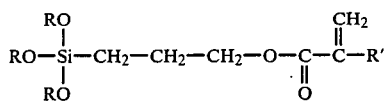

where R represents a lower alkyl group, and $R^3$ represents a hydrogen atom or a lower alkyl group, and forming a desired pattern in said resist film by using a lithography technique such that the number of said substituted silyl groups in the patterned resist film is at least $1 \times 10^{16}$ per 1 cm$^2$;

etching said organic polymer layer by a dry etching technique with the patterned resist film as a mask; and etching said substrate with the unetched areas of said organic polymer layer as a mask.

12. A method according to claim 11, wherein the material of said resist film is a copolymer of 3-trimethoxysilylpropyl methacrylate with an ethylenic unsaturated monomer not having said substituted silyl group.

13. A method according to claim 12, wherein said ethylenic unsaturated monomer is glycidyl methacrylate.

14. A method according to claim 1, wherein said dry etching technique is reactive sputter etching using oxygen gas.

15. A method of forming a pattern in the manufacture of microelectronic devices, the method comprising the steps of:

forming an organic polymer layer which can be etched by dry etching on a substrate to ultimately be etched;

forming a resist film directly on said organic polymer layer, the material of said resist film being poly(dimethylphenyl silylstyrene), and forming a desired pattern in said resist film by using a lithography technique such that the number of said substituted silyl groups in the patterned resist film is at least $1 \times 10^{16}$ per 1 cm$^2$;

etching said organic polymer layer by a dry etching technique with the patterned resist film as a mask; and etching said substrate with the unetched areas of said organic polymer layer as a mask.

16. A method of forming a pattern in the manufacture of microelectronic devices, the method comprising the steps of:

forming an organic polymer layer which can be etched by dry etching on a substrate to ultimately be etched;

forming a resist film directly on said organic polymer layer, the material of said resist film being a copolymer of dimethylphenylsilylstyrene with an ethylenic unsaturated monomer not having said substituted silyl group, and forming a desired pattern in said resist film by using a lithography technique such that the number of said substituted silyl groups in the patterned resist film is at least $1 \times 10^{16}$ per 1 cm$^2$;

etching said organic polymer layer by a dry etching technique with the patterned resist film as a mask; and etching said substrate with the unetched areas of said organic polymer layer as a mask.

17. A method of forming a pattern in the manufacture of microelectronic devices, the method comprising the steps of:

forming an organic polymer layer which can be etched by dry etching on a substrate to ultimately be etched;

forming a resist film directly on said organic polymer layer, the material of said resist film being a trimethylsilyl-substituted phenolic resin of novolak type comprising a structural unit

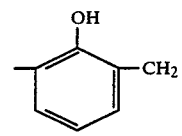

and another structural unit

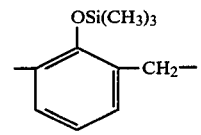

and forming a desired pattern in said resist film by using a lithography technique such that the number of said substituted silyl groups in the patterned resist film is at least $1 \times 10^{16}$ per 1 cm$^2$;

etching said organic polymer layer by a dry etching technique with the patterned resist film as a mask; and etching said substrate with the unetched areas of said organic polymer layer as a mask.

18. A method according to claim 17, wherein said dry etching technique is reactive sputter etching using oxygen gas.

19. A method according to claim 15, wherein said dry etching technique is reactive sputter etching using oxygen gas.

20. A method according to claim 16, wherein said dry etching technique is reactive sputter etching using oxygen gas.

21. A method according to claim 11, wherein said dry etching technique is reactive sputter etching using oxygen gas.

* * * * *